(12) United States Patent
Botos

(10) Patent No.: US 6,700,249 B1
(45) Date of Patent: Mar. 2, 2004

(54) DIRECT DRIVE VERTICAL LIFT AND ROTATION STAGE

(75) Inventor: Stephen J. Botos, Pittsburgh, PA (US)

(73) Assignee: Aerotech, Inc., Pittsburgh, PA (US)

( * ) Notice: Subject to any disclaimer, the term of this patent is extended or adjusted under 35 U.S.C. 154(b) by 28 days.

(21) Appl. No.: 10/299,888

(22) Filed: Nov. 19, 2002

(51) Int. Cl.⁷ .............................................. H02K 16/00
(52) U.S. Cl. ..................... 310/80; 310/12; 310/68 B; 310/112
(58) Field of Search ....................... 310/68 B, 154.33, 310/112, 12, 80; 318/135; 414/935, 936; 74/25

(56) References Cited

U.S. PATENT DOCUMENTS

| | | | | |
|---|---|---|---|---|
| 4,504,753 A | * | 3/1985 | Koch | 310/75 R |
| 4,521,707 A | * | 6/1985 | Baker | 310/80 |
| 4,749,898 A | * | 6/1988 | Suzuki et al. | 310/114 |
| 6,075,325 A | * | 6/2000 | Kouno et al. | 315/307 |
| 6,184,631 B1 | * | 2/2001 | Noma et al. | 315/224 |
| 6,355,999 B1 | * | 3/2002 | Kichiji et al. | 310/112 |
| 6,363,808 B1 | * | 4/2002 | Wakabayashi et al. | 74/490.03 |
| 6,486,574 B2 | * | 11/2002 | Botos et al. | 310/12 |
| 2001/0035698 A1 | * | 11/2001 | Nakatsuka et al. | 310/318 |

FOREIGN PATENT DOCUMENTS

| | | | | |
|---|---|---|---|---|
| JP | 2001-85759 | * | 3/2001 | H01L/41/107 |
| JP | 2001-258206 | * | 9/2001 | H02K/16/00 |

* cited by examiner

Primary Examiner—Burton Mullins
(74) Attorney, Agent, or Firm—Webb Ziesenheim Logsdon Orkin & Hanson, P.C.

(57) ABSTRACT

A direct drive vertical lift and rotation stage comprises an annular z-axis housing having a central opening, a z-axis rotor assembly journaled within the central opening of the z-axis housing, a motor between the z-axis housing and the z-axis rotor, an annular theta-axis housing having a central opening, a theta-axis rotor assembly journaled within the central opening of the theta-axis housing, and a motor between the theta-axis housing and the theta-axis rotor.

9 Claims, 2 Drawing Sheets

DIRECT DRIVE VERTICAL LIFT AND ROTATION STAGE

BACKGROUND OF THE INVENTION

In the manufacture of many devices, the need exists to lift and rotate the part, for example, in the manufacture of semiconductor devices. A semiconductor wafer is a thin, circular slice of pure silicon on which semiconductors are built. The largest wafer in current use is about 300 mm (12 inches) in diameter. Many individual semiconductor devices or "chips" can be fabricated on each wafer, depending on the chip and wafer size.

For inspection, test or fabrication, a wafer is mounted on a rotating stage that must be capable of orienting the wafer at precise angular positions about an axis perpendicular to the wafer surface. The stage must be rapidly rotated from one position to another. Such stages must also be adjustable in the vertical direction, although only about 10 mm or less of vertical adjustment is needed.

In the past, stages as above described have required complex mechanical components, such as worm gears, lead screws, and separate motors, all of which can be a source of positioning errors. Moreover, these mechanical components resulted in a bulky apparatus having an undesirably large footprint. Other direct drive technologies, such as piezoelectric drives, have limited travel range and require additional mechanical elements to extend their travel range.

SUMMARY OF THE INVENTION

It is an object of the present invention to provide a vertical lift and rotation stage without worm gears, lead screws, or separate drive motors.

It is a further object of the present invention to provide a small footprint vertical lift and rotation stage.

Briefly, according to the present invention, a direct drive vertical lift and rotation stage comprises an annular z-axis housing having a central opening and a z-axis rotor assembly journaled by a bearing assembly within the central opening of the z-axis housing. The z-axis rotor assembly has a threaded upper end. A first brushless permanent magnet motor is positioned between the z-axis housing and the z-axis rotor. An annular theta-axis housing has a central opening. The theta-axis housing has threads that engage the threads on the z-axis rotor. Linear bearings between the z-axis housing and the theta-axis housing prevent relative rotation. A theta-axis rotor assembly is journaled by a bearing assembly within the central opening of the theta-axis housing. A second brushless permanent magnet motor is positioned between the theta-axis housing and the theta-axis rotor. A linear position sensor detects vertical movement between the theta-axis housing and the z-axis housing and a rotary sensor detects rotating movement between the theta-axis rotor assembly and the theta-axis housing. The action of the first permanent magnet motor raises and lowers the theta-axis rotor assembly and the action of the second permanent magnet motor rotates the theta-axis rotor assembly.

In one embodiment, the permanent magnet motors comprise armature windings secured to the housing assemblies, rare earth permanent magnets secured to the rotor assemblies, and magnetic metal lamination stacks or steel ring support the armature windings.

The type of the position sensors employed will depend on the motion performance requirement, speed, resolution, accuracy, acceleration, etc. Position sensors, for example, may include incremental or absolute encoders of the magnetic or optical type. Position sensors may also comprise resolvers and related multipole devices.

Stops that limit the rotation of the theta-axis rotor to less than one revolution, home sensors and limit switches to constrain the vertical movement, and rotation of the theta-axis rotor are optional features.

BRIEF DESCRIPTION OF THE DRAWINGS

Further features and other objects and advantages will become apparent from the following detailed description made with reference to the drawings in which.

DESCRIPTION OF THE PREFERRED EMBODIMENT

Figure 1:
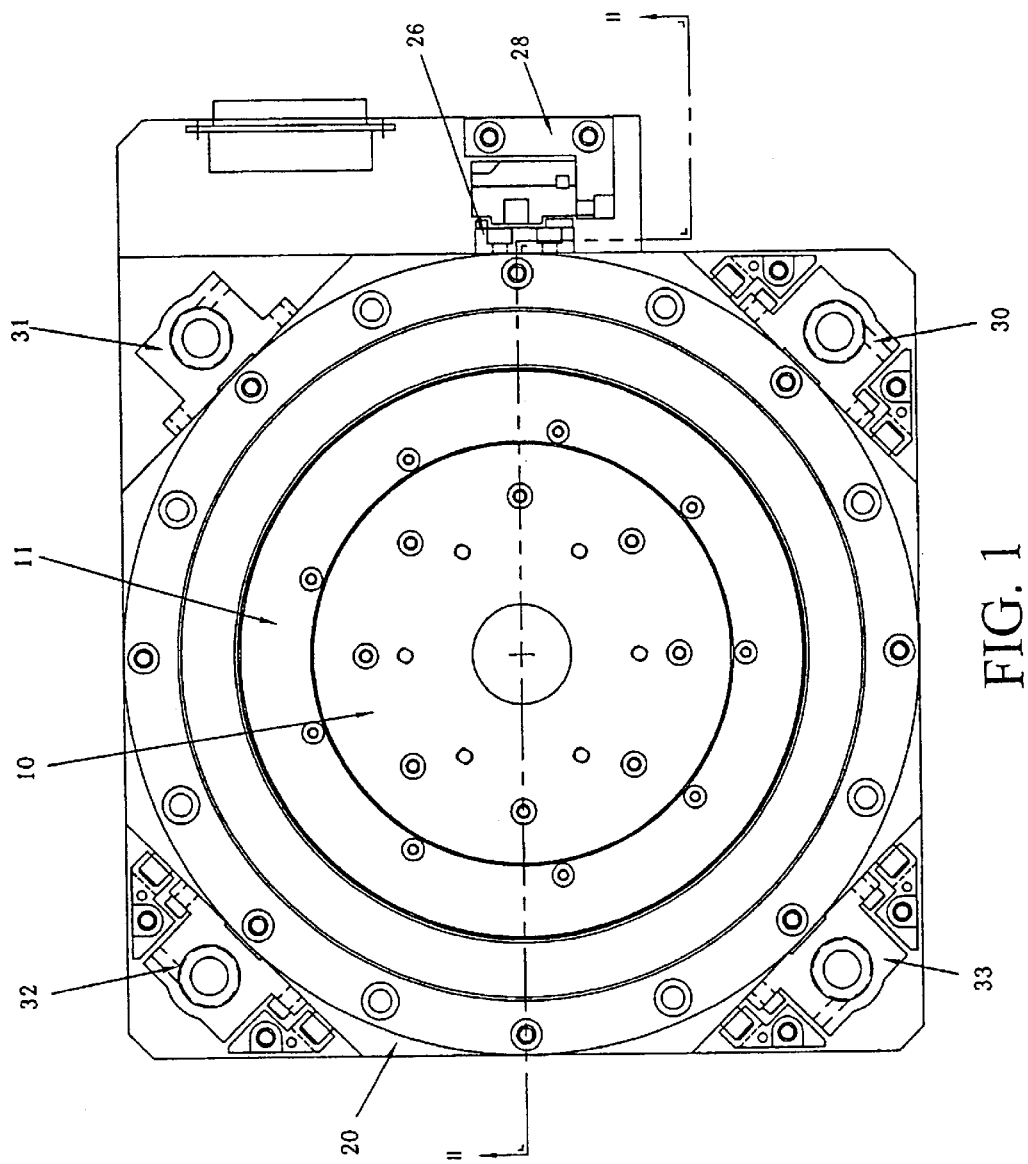
FIG. 1 is a plan view of a direct drive vertical lift and rotation stage according to the present invention.

Referring now to FIG. 1, a magnet shield 11 surrounds theta-axis rotor assembly 10 upon which a wafer is held during inspection. These elements rotate about an axis (the theta-axis) which is perpendicular to the top surface of the rotor assembly. Surrounding the rotor assembly is a theta-axis housing assembly 20 which has a central opening in which the theta-axis rotor is journaled by bearing.

The theta-axis housing assembly 20 moves vertically up and down carrying the theta-axis rotor assembly. The vertical motion of the theta-axis housing assembly is guided by linear bearings 30, 31, 32, and 33. The linear bearings precisely guide the theta-axis housing in its vertical motion (along the z-axis) and restrain rotation of the housing. The linear bearings may comprise recirculating linear ball bearings coupled with precision ground shafts or any other type of linear bearings, such as linear motion guides, cross roller bearings, linear ball bearings, and many other types.

The terms "z-axis" and "theta-axis" are commonly used terms in the motion control art. The z-axis is the generally vertical axis and the theta-axis is an axis of rotation. In the embodiment being described, these two axes are at least parallel and may even be collinear.

Figure 2:
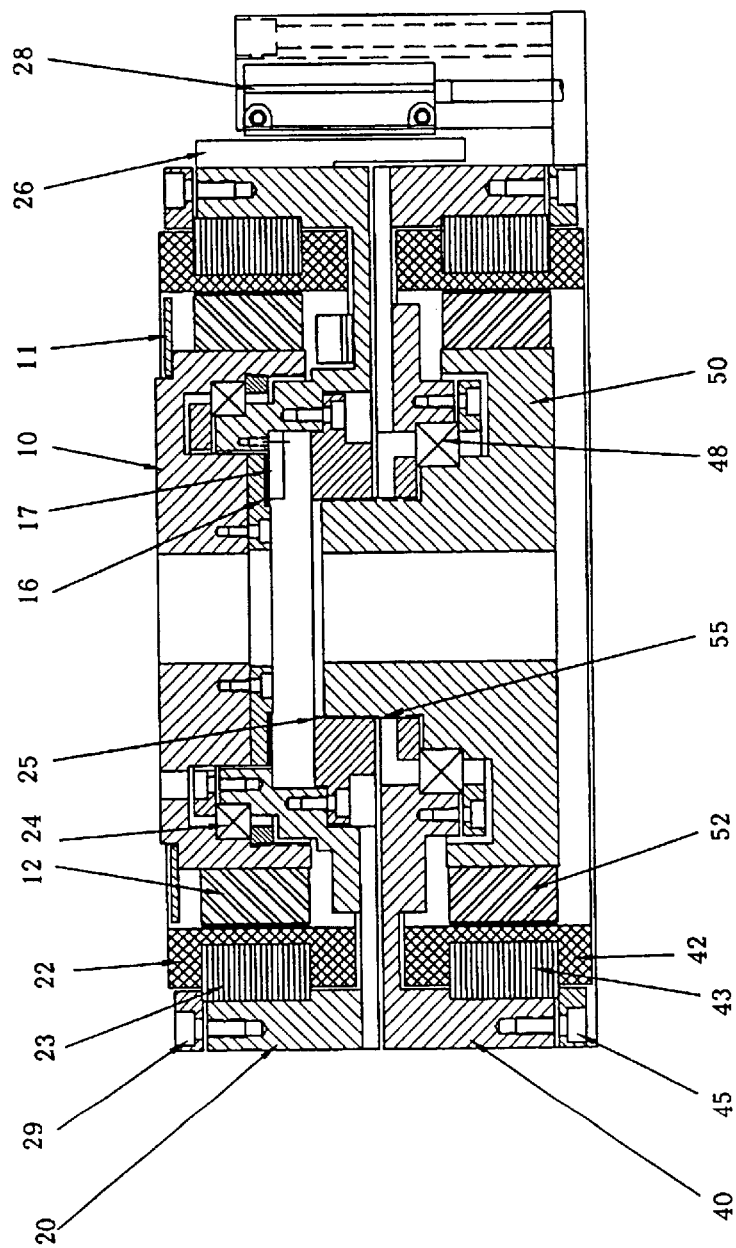
FIG. 2 is an elevation view in section taken along line II—II in FIG. 1.

Referring now to FIG. 2, the base of the lift and rotation stage is an annular z-axis housing assembly 40 with a central opening. A z-axis rotor assembly 50 is journaled by bearing 48 in the central opening of the z-axis housing assembly 40. Various precision bearings, including preloaded, may be used. A brushless permanent magnet motor comprises armature winding 42 and a winding support steel ring or lamination stack 43 fixed in the z-axis housing by mounting flange 45 and permanent magnets 52 mounted in the z-axis rotor assembly. The magnets have North and South poles aligned in the radial direction and alternating in the circumferential direction. Preferably, there is an even number of magnets spaced around the circumference of the z-axis rotor assembly and an even number of armature coils spaced around the z-axis housing assembly. In a most preferred embodiment, the coils are in three groups each energized by one of three phases.

The linear bearings 30, 31, 32, and 33 are all fixed relative to the z-axis housing 40 and theta-axis housing 20.

The z-axis rotor has threads 55 on the upper end thereof that engage threads 25 on the theta-axis housing. Rotation of the z-axis rotor 50 causes a vertical movement in the theta-axis housing which is prevented from rotating by the linear bearings 30, 31, 32, and 33. The vertical motion is measured by an incremental encoder comprised of a scale 26 mounted on the theta-axis housing and an encoder reader 28 mounted relative to the z-axis housing.

Incremental encoders are commonly used measurement transducers. Optical incremental encoders pass light from a lamp or light-emitting diode at a grating attached to the axis to be measured. The grating normally has two tracks offset 90 signal degrees apart with respect to each other (in quadrature). A single marker on a third track serves as a home marker (in the case of a rotary encoder, a once-per-revolution marker). The light reflected from the grating continues through a reticule or mask which, together with the grating, acts as a shutter. The shuttered light falling on a detector results in the generation of electrical signals. These signals are amplified and output as two amplified sinusoids or square waves in quadrature and are output on two separate channels as signals SIN and COS. With simple incremental encoders, the position is measured by counting the zero crossings (sinusoidal) or edges (square waves) of both channels. Where greater precision is required, the amplified sinusoidal signals (SIN and COS) are sent to an encoder multiplier where the intermediate positions are resolved at spaced time intervals.

An encoder multiplier uses the SIN and COS signals to resolve many positions within one grating period (scribe lines). The multiplier, for example, is able to produce up to 65,000 transitions within one grating period as opposed to the four by a simple incremental encoder. See, for example, U.S. Pat. No. 6,356,219.

Feedback from the incremental encoder is used to control the currents applied to each phase in the armature winding to precisely position the theta-axis housing in the vertical direction.

Referring again to FIG. 2, a brushless permanent magnet motor comprises an armature winding 22 and lamination stack or steel ring 23 fixed in the z-axis housing by mounting flange 29 and permanent magnets 12 mounted in the theta-axis rotor assembly. The magnets have North and South poles aligned in the radial direction and alternating in the circumferential direction. Preferably, there is an even number of magnets spaced around the circumference of the theta-axis rotor assembly and an event number of armature coils spaced around the theta-axis assembly.

In a most preferred embodiment, the coils are in groups of three, each energized by one of three phases. Each phase is individually energizable. The vertical motion is measured by an incremental encoder comprised of a scale 26 mounted on the theta-axis housing and an encoder reader 28 mounted relative to the z-axis housing.

Having thus defined the invention in the detail and particularity required by the Patent Laws, what is desired protected by Letters Patent are set forth in the following claims.

The invention claimed is:

1. A direct drive vertical lift and rotation stage comprising:

an annular z-axis housing having a central opening;

a z-axis rotor assembly journaled by a bearing assembly within the central opening of the z-axis housing, said z-axis rotor assembly having a threaded upper end;

a first brushless permanent magnet motor between the z-axis housing and the z-axis rotor;

an annular theta-axis housing having a central opening, said theta-axis housing having threads that engage the threads on the z-axis rotor;

linear bearings between the z-axis housing and the theta-axis housing to prevent relative rotation thereof;

a theta-axis rotor assembly journaled by a bearing assembly within the central opening of the theta-axis housing;

a second brushless permanent magnet motor between the theta-axis housing and the theta-axis rotor;

a linear motion sensor for detecting vertical movement between the theta-axis housing and the z-axis housing; and a rotary motion sensor for detecting rotating movement between the theta-axis rotor assembly and the theta-axis housing such that the action of the first permanent magnet motor raises and lowers the theta-axis rotor assembly and the action of the second permanent magnet motor rotates the theta-axis rotor assembly.

2. The direct drive vertical lift and rotation stage according to claim 1, wherein the permanent magnet motors comprise armature windings secured to the housing assemblies and rare earth permanent magnets secured to the rotor assemblies.

3. The direct drive vertical lift and rotation stage according to claim 2, wherein the armature windings are supported by lamination stacks or steel ring.

4. The direct drive vertical lift and rotation stage according to claim 3, wherein the incremental rotary encoder for rotating movement between the theta-axis rotor assembly and the theta-axis housing comprises an encoder scale mounted on the theta-axis rotor and an encoder reader mounted on the theta-axis housing.

5. The direct drive vertical lift and rotation stage according to claim 3, wherein the incremental linear encoder for detecting vertical movement between the theta-axis housing and the z-axis housing comprises an encoder scale mounted on the theta-axis housing and an encoder reader mounted relative to the z-axis housing.

6. The direct drive vertical lift and rotation stage according to claim 3, wherein stops limit the rotation of the theta-axis rotor to less than one revolution.

7. The direct drive vertical lift and rotation stage according to claim 3, further comprising home sensors and limit switches to constrain the vertical movement and rotation of the theta-axis rotor.

8. The direct drive vertical lift and rotation stage according to claim 3, wherein the armature windings are two or three phase windings.

9. The direct drive vertical lift and rotation stage according to claim 3, wherein the vertical and rotary positions are precisely controlled by feedback from motion sensors.

* * * * *